United States Patent [19]
New et al.

[11] 3,868,720
[45] Feb. 25, 1975

[54] HIGH FREQUENCY BIPOLAR TRANSISTOR WITH INTEGRAL THERMALLY COMPENSATED DEGENERATIVE FEEDBACK RESISTANCE

[75] Inventors: Thorndike C. New, Scottsdale, Ariz.; Surinder Krishna, Ballston Lake, N.Y.

[73] Assignee: Westinghouse Electric Corporation, Pittsburgh, Pa.

[22] Filed: Dec. 17, 1973

[21] Appl. No.: 425,668

[52] U.S. Cl. .................. 357/34, 357/35, 357/36, 357/63

[51] Int. Cl. .................. H01l 15/00, H01l 11/00

[58] Field of Search .................. 317/235, 40.1

[56] References Cited

UNITED STATES PATENTS

| | | | |
|---|---|---|---|
| 3,445,727 | 5/1969 | Maple | 317/235 X |
| 3,504,239 | 3/1970 | Johnson et al. | 317/235 X |
| 3,769,563 | 10/1973 | Krishna et al. | 317/235 X |

*Primary Examiner*—Andrew J. James
*Attorney, Agent, or Firm*—C. L. Menzemer

[57] ABSTRACT

A high frequency bipolar transistor is provided with integral thermally compensated degenerative feedback resistance. The emitter, base and collector regions of the transistor are positioned in an epitaxial layer of a semiconductor body adjoining a major surface with an adjoining substrate portion having an impurity concentration greater than about $1 \times 10^{18}$ carriers/cm$^3$. The emitter region adjoins the major surface in at least one strip configuration preferably of width less than about 10 microns, and has an impurity concentration at the major surface of at least about $1 \times 10^{18}$ carriers/cm$^3$. The collector region adjoins the substrate portion and the major surface spaced from the emitter region has a thickness of less than about 10 microns at the active portions, and has an impurity concentration therethrough of less than about $1 \times 10^{14}$ carriers/cm$^3$. The base region has a thickness of less than 2 microns and an impurity concentration between about $5 \times 10^{14}$ and $5 \times 10^{17}$ carriers/cm$^3$ between the emitter and collector regions in the epitaxial layer and adjoins the major surface at least peripherally of the emitter region. First, second and third metal contacts spaced substantially parallel of strip configurations make separate ohmic contact to the emitter base and collector regions, respectively. A dielectric layer is applied on the major surface at least adjacent the first metal contact, with a conductor layer of strip configuration on the dielectric layer spaced from and extending substantially parallel to the first metal contact. And a degenerative resistor layer on the first contact, the dielectric layer and the conductor layer extends substantially the length of the first metal contact and the conductor layer and makes ohmic contact to both the first metal contact and the conductor layer along the length thereof, while remaining substantially insulated from the second and third metal contacts and the base and collector regions.

4 Claims, 6 Drawing Figures

HIGH FREQUENCY BIPOLAR TRANSISTOR WITH INTEGRAL THERMALLY COMPENSATED DEGENERATIVE FEEDBACK RESISTANCE

FIELD OF THE INVENTION

The present invention relates to semiconductor devices and particularly high power, high frequency bipolar transistors.

BACKGROUND OF THE INVENTION

Bipolar transistors capable of high frequency operation, i.e., in the GHz range, generally require high current densities for high power operation. Particularly, when these devices are designed to operate from low voltage supplies (e.g. 13.5 volts), there is a premium on the ability of the transistor to carry large amounts of current. As the operating current increases, however, the cut-off frequency decreases because the emitter charging time is inversely proportional to the current density. For this reason, large area transistors and/or a plurality of transistors in parallel are usually provided for high power, high frequency operation.

The difficulty with such parallel operation is thermal runaway. The electrical characteristics will vary from area to area and transistor to transistor resulting in non-uniform current densities. This non-uniformity in turn causes increased current densities in the areas of highest density, resulting in localized overheating and eventually catastrophic failure.

Thermal runaway is typically eliminated by degenerative feedback. That is, a resistance is placed in series with each small emitter segment of each transistor. This resistance causes a decrease in potential between emitter and collector as the current density increases. In turn, localized non-uniformity in current density is compensated and thermal runaway virtually eliminated.

Presently, degenerative feedback is typically provided by diffused resistors, thin film resistors or bulk silicon resistors. They may be located on the same semiconductor wafer with the high frequency transistor on transistors. However, when integrally positioned on the same wafer, the heat generated by the resistors must be dissipated without causing temperature variations between the various emitter areas or segments. Otherwise, another form of thermal runaway will result. That is, localized heating will occur causing non-uniform carrier injections from the emitter regions into the base regions. Positioning the resistor elements integral with the transistor body or bodies has, therefore, been a sensitive operation requiring compromises in manufacturing yields and in operating characteristics.

Another dificulty with high power, high frequency bipolar transistors is the need for large area devices to provide the power capacity. Increases in area (such as employing larger numbers and longer lengths of emitter and base strips) is typically the means to increase the power of the device. Such increases in area, however, drastically lowers the input impedance of the transistor at high frequencies and in turn cause instability in the operation of the transistor. Further, this impedance decrease, corresponding increases the Q of the device and makes impedance matching with external circuits exceedingly difficult without added complex circuitry.

The present invention essentially eliminates these disadvantages and difficulties of prior devices. A high power, high frequency transistor is provided with integral degenerative feedback resistance such that the heat dissipation effect on the emitter elements is uniformly distributed. Further, the invention concurrently provides for increased stability and simplified impedance matching with external circuits.

SUMMARY OF THE INVENTION

A high frequency bipolar transistor with integral thermally compensated degenerative feedback is provided in a semiconductor body having at least one major surface. The semiconductor body has an epitaxial layer adjoining the major surface and a substrate portion adjoining the epitaxial layer in interior portions of the body. The substrate portion has an impurity concentration therethrough of greater than about $1 \times 10^{18}$ carriers/cm$^3$ of a given carrier-type.

Emitter, base and collector regions of the transistor are formed in the epitaxial layer. The emitter region adjoins the major surface of the body and has a surface impurity concentration at the surface of greater than about $1 \times 10^{18}$ carries/cm$^3$ of a carrier-type the same as the carrier-type of the substrate portion. The emitter region is in at least one strip configuration and preferably two strip configurations typically of less than about 10 microns and most desirably less than about 2 microns in width. The emitter region also preferably has a thickness at the active portions of less than about 2 microns.

The collector region adjoins the substrate portion, and also adjoins the major surface spaced from the emitter region. The collector region has an impurity concentration therethrough of less than about $1 \times 10^{14}$ carriers/cm$^3$ of a carrier-type the same as the carrier-type of the substrate portion and a thickness at the active portions of the device of less than about 10 microns.

The base region has active portions thereof in the interior between the emitter and collector regions and also adjoins the major surface of the body at least peripherally of the emitter region. At the active portions, the base region has an impurity concentration between about $5 \times 10^{14}$ and $5 \times 10^{17}$ carriers/cm$^3$ and has a thickness less than about 2 microns and most desirably between 0.1 and 1.0 microns. The carrier-type of the base region is opposite to the carrier-type of the emitter and collector regions and forms PN junctions therewith.

Ohmic contacts are separately made to the emitter, base and collector regions by first, second and third metal contacts, respectively. The metal contacts are positioned on the major surface of the body and have strip configurations. The metal contacts are spaced from and substantially parallel to each other. A dielectric layer is also positioned on the major surface at least adjacent the first metal contact with a conductor layer of a strip configuration on the dielectric layer extending substantially parallel to the first metal contact.

The transistor is completed by a degenerative resistor layer on the first metal contact, the dielectric layer and the conductor layer. The resistor layer extends substantially the length of the first metal contact and conductor layer and makes ohmic contact with both the first metal contact and the conductor layer typically substantially the length thereof, while remaining substantially insulated from the second and third metal contacts and the base and collector regions. In this connection, it is preferred that the ohmic contact to the first metal contact is made only adjacent edge portions of the contact that are opposite from the conductor layer. In addition, the emitter region is preferably in two spaced apart, substantially parallel strip configurations, with the conductor layer spaced substantially parallel therebetween.

By this arrangement, the degenerative resistor layer is substantially uniformly distributed along the transistor. More importantly, any rise in temperature due to heat dissipation by the resistor layer will substantially uniformly affect the entire emitter region along the length of the device. The heat dissipation of the resistor layer is compensated by discouraging non-uniform carrier injection from the emitter into the base regions due to localized hot-spots. More reliable high frequency performance, as well as semiconductor geometry economies, are obtained due to the uniform current distribution and uniform heat transfer.

In addition, it is preferred that a second conductor layer of strip configuration is provided on the dielectric layer substantially parallel to and spaced from the second metal contact which ohmically contacts the base region. A second resistor layer is then applied on the second metal contact, the dielectric layer and the second conductor layer extending substantially the length of the second metal contact and the second conductor layer. The second resistor layer makes ohmic contact to both the second metal contact and the second resistor layer along the length thereof, while remaining substantially insulated from the first and third metal contacts and the emitter region and the collector regions. By this arrangement, the stability of the transistor is increased, and greater flexibility is provided in matching the transistor to external circuit impedance.

Other details, objects and advantages of the invention will become apparent as the following description of the presently preferred embodiments and presently preferred method of practicing the same proceeds.

BRIEF DESCRIPTION OF THE DRAWINGS

In the accompanying drawings, the present preferred embodiments of the invention and the present preferred methods of practicing the invention are illustrated, in which.

DESCRIPTION OF THE PREFERRED EMBODIMENTS

Figure 1:
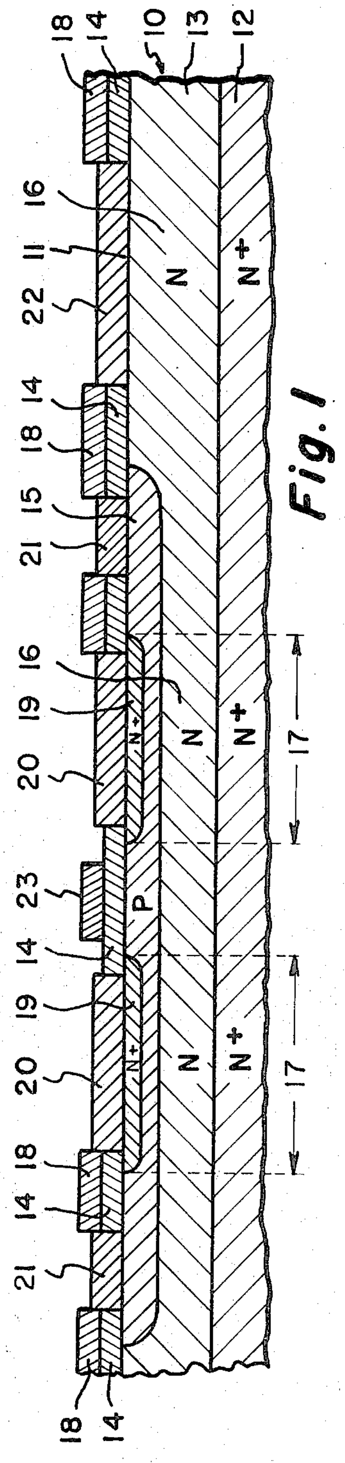
FIGS. 1 to 3 are partial elevational crosssectional views taken along lines I—III—I—III of FIG. 4 of a high frequency transistor in embodying the present invention at various stages in its manufacture.

Referring to FIG. 1, semiconductor body or wafer 10 having major surface 11 is provided as a starting point for production of a high frequency bipolar transistor in accordance with the present invention. The body is made by first obtaining a commercially available single crystal semiconductor wafer or substrate 12 having a substantially uniform impurity concentration of greater than $1 \times 10^{18}$ carriers/cm$^3$ therethrough. The carrier-type of the substrate is selected to be either N-type or P-type electrons or holes. The choice of carrier-type will depend on whether an NPN or PNP transistor is desired.

The choice of an NPN or PNP transistor, as well as the selection of semiconductor material, depends upon the circuit application and the device technology. The semiconductor material is typically either germanium, silicon or gallium arsenide, with gallium arsenide being preferred for high frequency operation because of its high carrier velocity which provides for the highest obtainable cut-off frequency. Further, the transistor is preferably an NPN rather than a PNP transistor because of the higher cut-off frequency of NPN because the minority carrier (electron) mobility in the base region and the majority carrier (also electron) mobility in the collector region are larger for the NPN transistor.

Typically substrate 12 measures about 1/20th to 1/10th inch square and is between 250 and 500 microns in thickness. Semiconductor body 10 is provided from substrate 12 by growth of epitaxial layer 13. Epitaxial layer 13 is formed by first polishing mechanically and chemically substrate 12 so that the major surface thereof is oriented in the (100) crystallographic plane or about 2° off from the (111) crystallographic plane of the single crystal semiconductor material. The epitaxial layer 13 is then grown on the major surfaces of substrate 12 by, for example, pyrolysis of monosilane ($SiH_4$) introduced, with a hydrogen ($H_2$) carrier gas, into a reactor furnace that is heated to a relatively high deposition temperature (typically greater than 1200°C).

Epitaxial layer 13 is typically grown to a thickness of 10 to 20 microns as is desired for the dimensions of the particular high frequency transistor as hereinafter described. Further, preferably epitaxial layer 13 is doped during growth to a substantially uniform impurity concentration therethrough of less than about $1 \times 10^{14}$ carriers/cm$^3$. This is accomplished by mixing with the monosilane and carrier gas, prior to introduction into the reactor furnace, an impurity gas appropriate for the particular impurity desired. For example, if an N-type impurity such as phosphorus or arsenic is desired, phosphine ($PH_3$) or arsenine ($AsH_3$) is introduced into the reactor. If P-type doping is desired, typically diborane ($B_2H_6$) will be introduced as the impurity gas into the reactor. Alternatively, the epitaxial layer may be diffusion doped after growth, but this technique is not generally preferred.

To make a transistor in accordance with the invention from semiconductor body 10, dielectric layer 14 is grown or deposited on major surface 11 of semiconductor body 10. Typically dielectric layer 14 is silicon dioxide which, if body 10 is silicon, can be grown by heating the silicon wafer at a temperature between about 1000° and 1100°C in a flow of oxygen or steam. In this connection, steam is more often used because it results in a higher rate of oxide growth. Typically, the oxide thickness is about 10,000 Angstroms, produced by heating in steam at 1,000° - 1,100°C for about 4 hours.

Alternatively, particularly where body 10 is not silicon, the silicon dioxide can be deposited by RF sputter deposition of silicon dioxide by standard techniques. Alternatively, silicon nitride ($Si_3N_4$), aluminum nitride (AlN) or aluminum oxide ($Al_2O_3$) may be used in place of silicon dioxide for the dielectric layer. The latter would require heating the silicon semiconductor body in a nitrogen rich atmosphere or sputter depositing silicon nitride, aluminum nitride, or aluminum oxide by RF sputtering techniques.

After deposition of dielectric layer 14, a suitable elongated window pattern is opened in layer 14 for diffusion of base region 15. This step can be accomplished by any standard photo- or electro- lithographic technique. For the fine dimensions, high frequency transistors, preferably electro-lithographic techniques are used. The latter may be accomplished by use of a scanning electron beam from a standard electron microscope moving through a matrix on command from a digital computer. However, for very small spacing and high resolution, an electron resist with the electron image projection system can be used. The electron image projection system is described in U.S. Pat. Nos. 3,679,497 and 3,710,101, granted July 25, 1972 and Jan. 9, 1973, respectively, both assigned to the assignee of this application. In any case, the window pattern is formed in dielectric layer after development of the resist layer typically with a standard etch technique, for example, with an alcohol, ketone or mixture thereof, to dissolve irradiated acrylic or methacrylic electron sensitive polymers.

After opening the window pattern for the base diffusion, the base region 15 is diffused by standard diffusion techniques. For example, for a P-type diffusion, body 10 is disposed in a reactor furnace at a temperature on the order of 1000°C in the presence of an atmosphere containing the desired doping impurity or a compound thereof. The diffusion may be performed by either an opened or closed tube technique. A closed tube, however, requires the use of a solid diffusion source; an opened tube permits the use of either a gaseous diffusion source or a solid diffusion source. In either technique, preferred solid diffusion sources for boron are boric acid or boron oxide. However, a gaseous diffusion source is preferred with an open tube to avoid the need for auxiliary equipment to vaporize the diffusion source. The preferred gaseous diffusion source for boron is diborane ($B_2H_6$). Alternatively, for an N-type base region, phosphorus or arsenic may be diffused preferably from a gaseous source such as phosphine or arsenine gas. Further, a constant-source or a limited-source diffusion technique may be used, although a constant-diffusion source technique is preferred.

Irrespective of the diffusion technique, the diffusion is continued to a depth sufficient to provide collector region 16 with a thickness at active portions 17 of less than about 10 microns. Further, the diffusion is such that the base region 15 at the active portions 17 have an impurity concentration between about $5 \times 10^{14}$ and $5 \times 10^{17}$ carriers/cm$^3$ and the base region 15 adjoins surface 11 in an elongated preferably rectangular and strip configuration.

After the base diffusion, dielectric layer 18 is formed closing the window pattern in dielectric layer 14 and extending the remaining portions of dielectric layer 14. Dielectric layer 18 is of the same composition as dielectric layer 14 and is preferably formed in the same way. Typically, the layer 18 is extended so that the dielectric layer overlying the closed window pattern has a thickness of about 10,000 Angstroms.

Thereafter, a second window pattern is suitable spaced apart and substantially parallel strip configurations is opened in dielectric layer 18 to provide for diffusion of the emitter region 19. The window pattern can be opened by any suitable photo- or electro- lithographic techniques. Preferably, however, the window pattern is opened by one of the preferred electron lithographic techniques the same as the window pattern for the base diffusion to provide small dimensional windows with high resolution.

Emitter regions 19 are then diffused by one of the standard diffusion techniques as described in connection with the diffusion of base region 15. The diffusion is carried to a depth sufficient to provide a base thickness at the active portions 17 of less than about 2 microns and most desirably between 0.1 and 1 micron. The diffusion also provides an impurity concentration at the surface 11 of greater than about $1 \times 10^{18}$ carriers/cm$^3$ and preferably between $1 \times 10^{19}$ and $1 \times 10^{21}$ carriers/cm$^3$. The carriertype of the emitter region 19 is the same as the carriertype of the substrate 12 and is preferably N-type to provide better high frequency operation. Consonant with the window pattern in dielectric layer 18, emitter region adjoins major surface 11 in strip configurations spaced apart and substantially parallel to each other.

First, second and third metal contacts 20, 21 and 22 are then simultaneously formed to make ohmic contact with emitter region 19, base region 15 and collector region 16, respectively. First additional window patterns in suitable spaced apart substantially parallel strip configurations are opened in dielectric layers 14 and 18 for second and third metal contacts 21 and 22. This step is accomplished by standard photo- or electro- lithographic techniques and a suitable etch. After opening the additional window patterns, the contacts are simultaneously formed by vaporizing aluminum, gold or some other suitable metal over the assembly to close the window patterns and form a contiguous metal layer over the dielectric layers and the exposed portions of major surface 11. A "reverse" or "negative" mask, again preferably with use of the electron image projection system, is formed over the contiguous metal layer and an appropriate etch such as 10% sodium hydroxide solution is then used to remove the metal layer from everywhere but in and adjacent the window patterns to form first, second and third metal contacts 20, 21 and 22 in spaced apart, substantially parallel strip configurations. The metal remaining in the window patterns is alloyed to the semiconductor body 10 by heating the body 10 to form low resistance ohmic contact.

Simultaneously with the metal contact is formed conductor layer 23 in strip configuration parallel to and spaced between the strips of first contact 20 to the emitter region 19. Conductor strip or layer 23 is formed of the same metal as first, second and third metal contacts and therefore is formed from the same contiguous metal layer by the same lithographic and etch steps as used to form the metal contacts.

Figure 2:
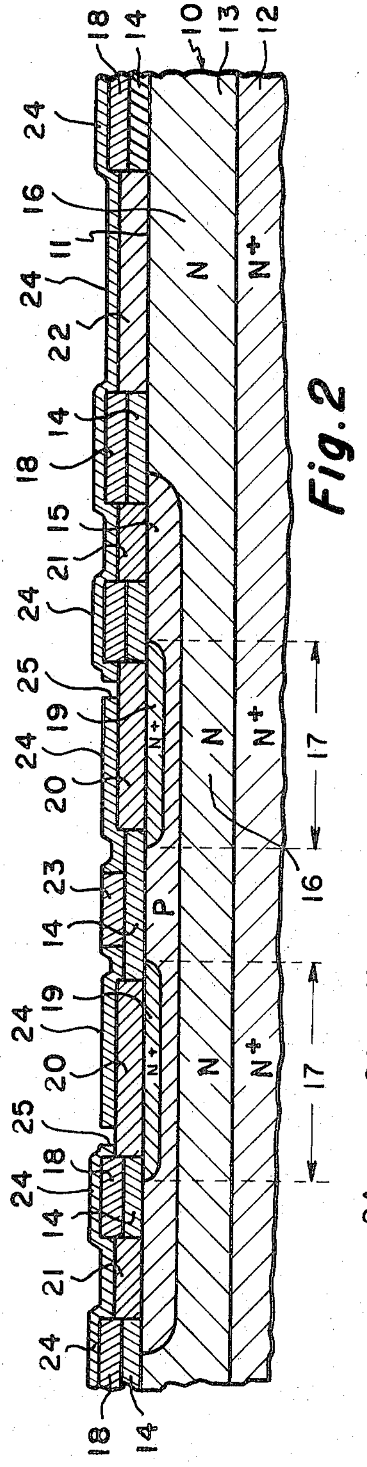

Referring to FIG. 2, dielectric layer 18 is extended and contacts 20 are covered except for a small contact opening by dielectric layer 24. The dielectric layer is deposited by low temperature techniques such as RF sputtering or pyrolytic deposition to avoid alloying of the metal contacts with the semiconductor body 10 or significant diffusion and dislocation of the impurity regions within the semiconductor body 10. The low temperature deposition forms a contiguous dielectric layer over the entire exposed portions of dielectric layer 18, metal contacts 20, 21 and 22 and conductor layer 23. A "reverse" or "negative" mask, again preferably with the use of the electron image projection system, and etch are used to remove the dielectric layer 24 from openings 25 and from conductor layer 23. Openings 25 expose portions of metal contact 20 adjacent edge portion of contact 20 that are opposite from conductor layer 23.

Figure 3:
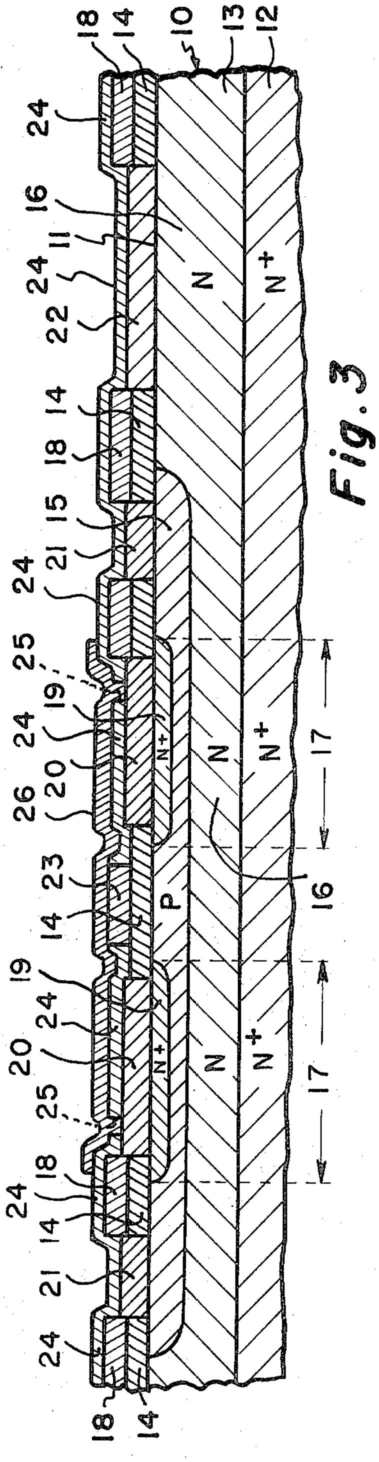

Referring to FIG. 3, degenerative resistor layer 26 is formed on first metal contact 20 at openings 25, on dielectric layer 24 and on conductor layer 23. This step is accomplished by vaporizing chromium, nickel or some other suitable metal over the exposed portions of the assembly to form a contiguous metal resistor layer over the assembly. A "reverse" or "negative" mask, preferably with the electron image projection system, is formed, and an appropriate etch such as 10% sodium hydroxide solution is used to remove the metal resistor layer from everywhere but in and adjacent the metal contacts 20, conductor layer 23 and dielectric layer 24 between contacts 20 and layer 23 along the lengths thereof. Degenerative resistor layer 26 thus makes ohmic contact to both first metal conductor 20 and conductor layer 23 along the length thereof, while remaining substantially insulated from second and third metal contacts 21 and 22 and base and collector regions 15 and 16.

FIG. 3 thus shows a partial cross-sectional view of a finished high frequency transistor embodying the present invention. Emitter region 19 is in spaced apart, substantially parallel strip configurations adjoining major surface 11. Collector region 16 adjoins substrate portion 12 and also adjoins major surface 11 spaced from emitter region 19. And base region 15 is positioned between emitter region 19 and collector region 16 in interior portions of epitaxial layer 13 and adjoins major surface 11 at the periphery of and between emitter regions 19.

Figure 4:
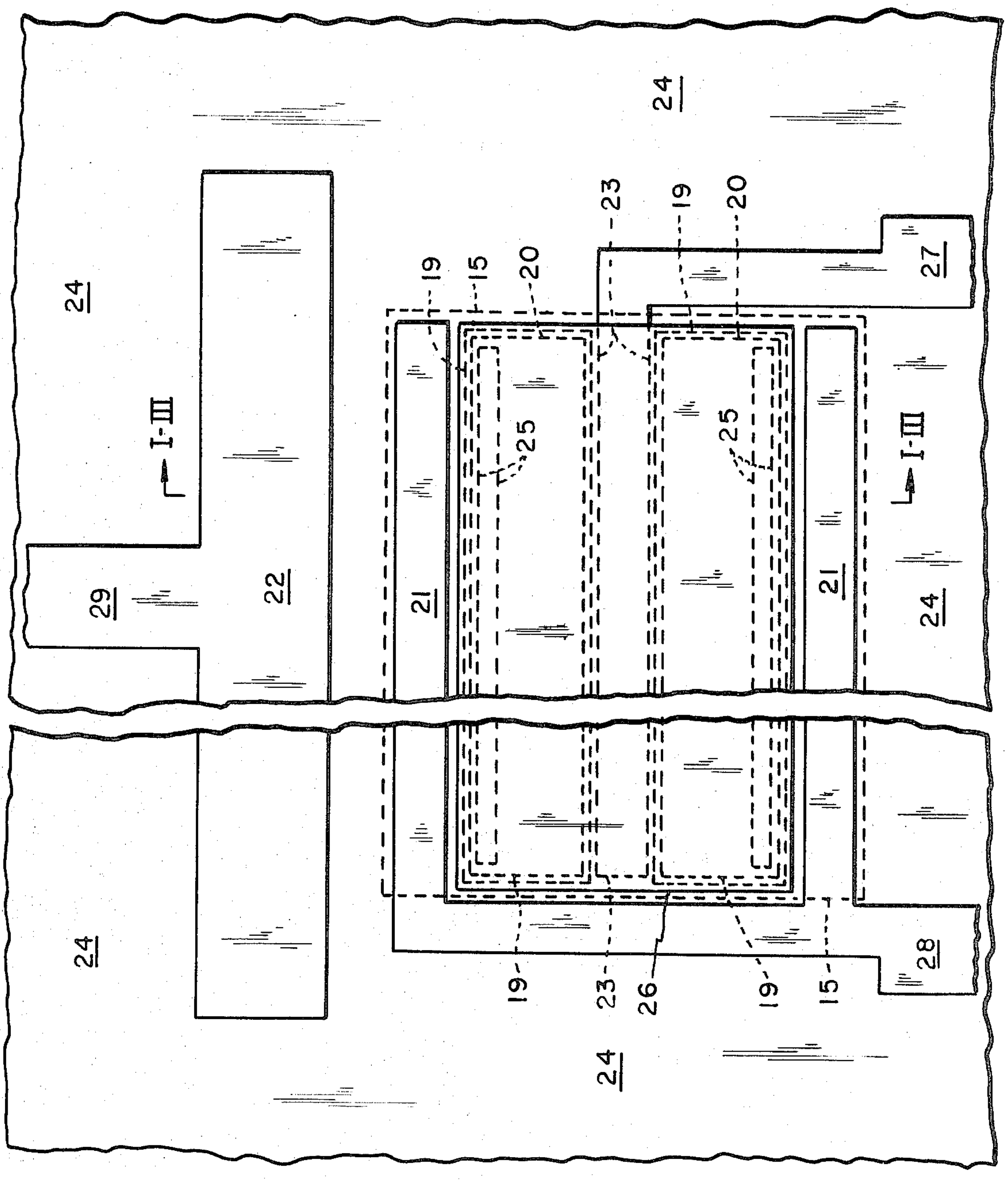
FIG. 4 is a partial top view of a high frequency transistor embodying the present invention and showing the cross-sectional cut of FIGS. 1 through 3.

Referring to FIG. 4, the configurations and relative positions of the elements of the transistors are better seen. The emitter region 19 is in strip configurations spaced apart and substantially parallel to each other. Similarly, first metal contact 20 is in strips spaced apart and substantially parallel to each other, with conductor layer 23 in a strip configuration spaced from and substantially parallel to and between the strips of metal contacts 20. Also it can be readily seen from FIG. 4 that the contacts of degenerative resistor layer 26 is made to first metal contacts 20 adjacent edge portions thereof opposite from contact layer 23. Further, it can be seen that the third metal contact 22 to collector region 16 is spaced from and substantially parallel to first and second metal contacts 20 and 21 in a strip configuration.

In addition, it can be seen from FIG. 4 that microstrip input and output leads 27, 28 and 29 to conductor layer 23 and metal contacts 21 and 22, respectively, can be simultaneously provided during the manufacture of the transistor. Such microstrips eliminate the lead parasitics resulting from high frequency operation by providing a constant impedance transmission line, see Electronics Design 1, Jan. 4, 1970, p. 100. The microstrip leads are preferably formed simultaneously with the metal contact and conductor layer on dielectric layers 14, 18 and/or 24. Further, preferably the widths of the microstrip leads are varied as shown in FIG. 4 to match the external impedance of the circuit to which the device is to be connected.

The power capacity of the resulting high frequency transistor is readily controlled by the horizontal geometry of the emitter and base regions and the metal contacts thereto. As previously noted, the collector region 16 is less than 10 microns in thickness at the active portions to eliminate stored charge from the device and raise the cutoff frequency. As the collector thickness increases, however, there is a corresponding decrease in breakdown voltage. Compromises must therefore be made in voltage capacity for high frequency operation and in turn high power is provided by increasing the current density within the device. In turn, the power capacity of the transistor is typically increased by increasing the number of emitter and base strips and increasing the length of the emitter and base strips.

Figure 5:
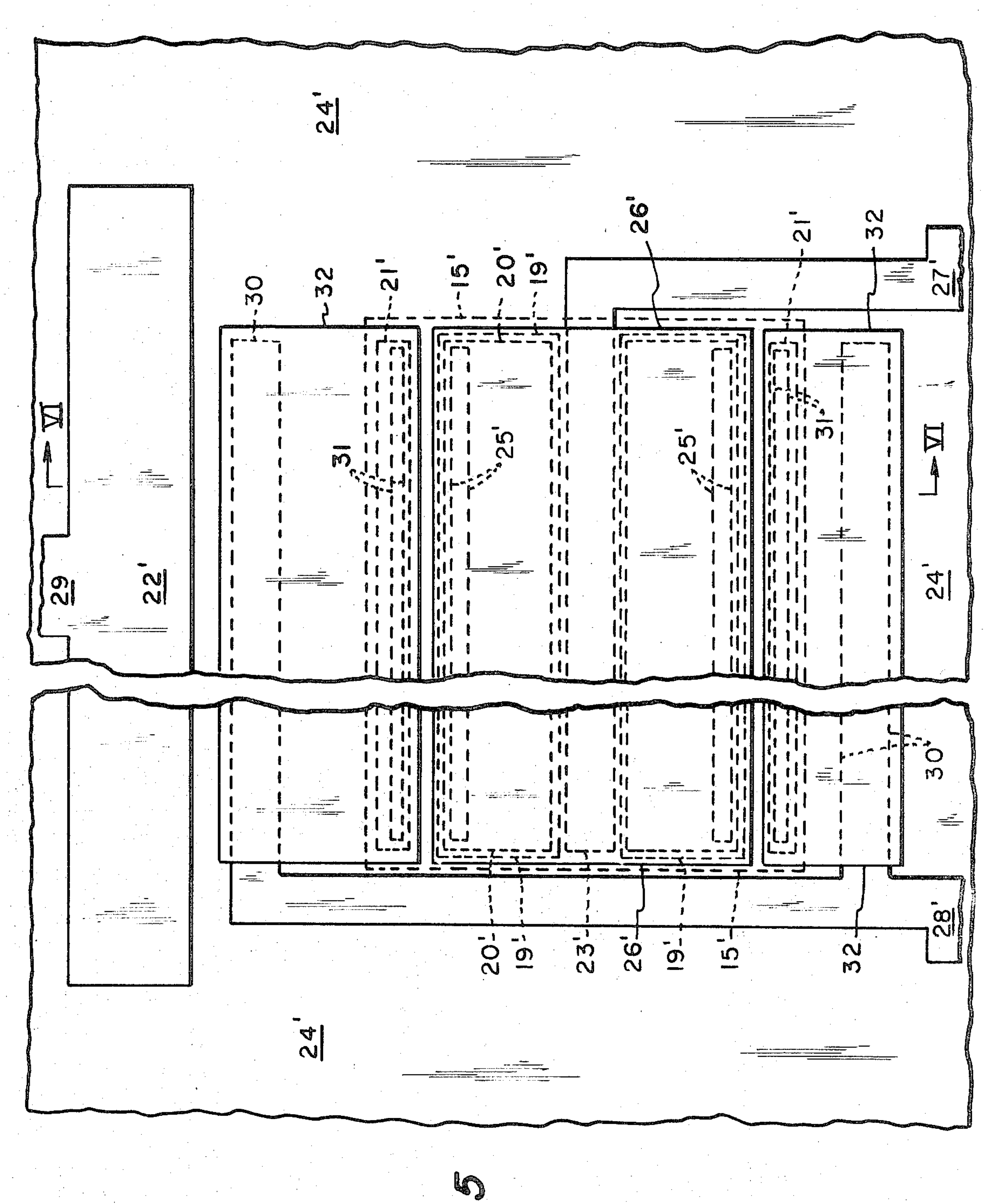
FIG. 5 is a partial top view of an alternative high frequency transistor embodying the present invention.
Figure 6:
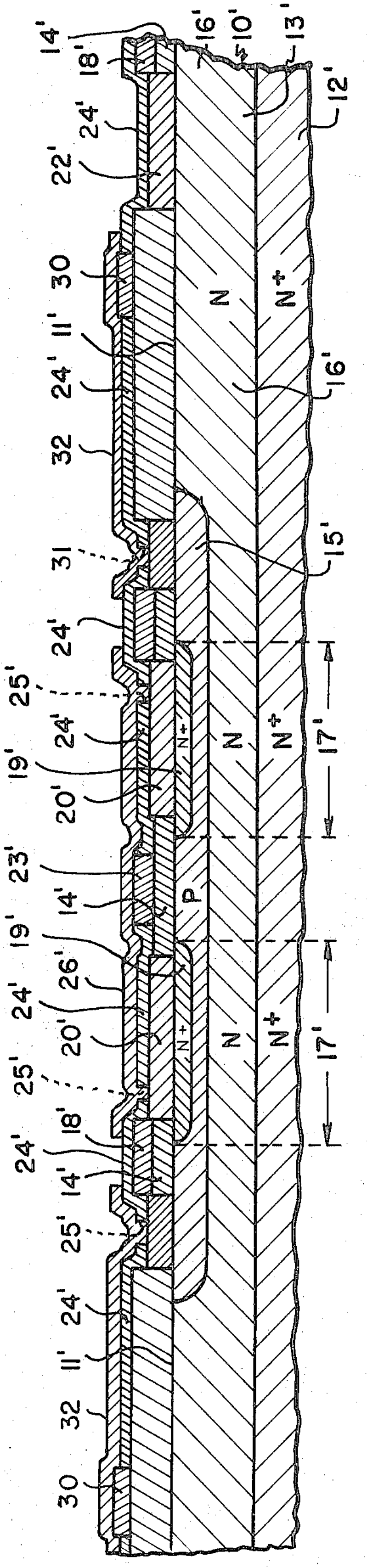
FIG. 6 is a partial cross-sectional view taken along line VI—VI of FIG. 5.

Referring to FIGS. 5 and 6, an alternative high power, high frequency bipolar transistor embodying the present invention is shown in which increased signal stability and simplified impedance matching is provided. The transistor is the same as that described in connection with FIGS. 1 through 4 except for second metal contact 21' to base region 15'. Second metal contacts 21' do not directly connect to microstrip lead 28; rather, second conductor layers 30 in strip configuration are provided spaced apart and substantially parallel to second contacts 21' on dielectric layers 14, 18 and 24. Second conductor layers 30 are preferably formed simultaneously with first, second and third metal contacts 20, 21 and 22 and conductor layer 23 and are, of course, of the same composition.

Similarly, openings 31 are provided through dielectric layer 24' simultaneously with the formation of openings 25' to expose portions of second metal contacts 21' preferably adjacent edge portions opposite from second conductor layer 30. Thereafter, second resistor layer 32 is formed on second metal contact 21 at openings 31, on dielectric layer 24' and on second conductor layer 30 extending substantially the length of second metal contact 21' and second conductor layer 30. The second resistor layer 32 makes ohmic contact therefore with second metal contact 21' and second conductor layer 30 along the length thereof, while remaining substantially isolated from first and third metal contacts 20' and 22', first conductor layer 23' and collector and emitter regions 16 and 19 of the transistor. The effect of this arrangement is to provide a substantially uniform resistor in the base circuit to increase the input impedance. Instability of the circuit from signal oscillations is thus reduced. Further, the input is far less frequency selective and in turn, the ratio of the gain bandwidth to the input impedance, i.e., the Q of the circuit, is maintained more uniformly over high frequencies so that the device has broader band capabilities. In short, the impedance of the circuit is far less frequency dependent and the device can be matched to the impedance of the external circuit far more readily.

It should be noted that the invention results in (i) judicious use of the semiconductor material, and (ii) increased passivation of the device. Specifically, the degenerative resistor layer is provided integral with the high frequency transistor with no extra space requirements on the semiconductor body, which is a particularly good advantage for power integrated circuits.

This, in turn, provides greater design flexibility and tailoring of the device to specific application needs.

Finally, the dielectric layers and the resistor layers form protective coatings on the metal contacts and conductor layers. This protects the metal contacts and conductor layers from oxidation and corrosion particularly in severe environments. This protective coating is also a particular advantage where it is desired to make the metal contacts and conductor layers of reactive metals such as aluminum. Further, the resistor layer dichemically isolates the metal contacts from the input and output leads which may be of different metals. for example, the resistor layer may isolate metal conductor layers of gold from metal contacts of aluminum and thus avoid the formation of undesirable compounds, e.g., the "purple plague".

While the present preferred embodiments have been shown and described with particularity, it is distinctly understood that the invention may be otherwise variously performed within the scope of the following claims.

What is claimed is:

1. A high frequency bipolar transistor with integral thermally compensated degenerative feedback resistance comprising:

A. a semiconductor body having at least one major surface; said body having an epitaxial layer adjoining the major surface, and having substrate portion adjoining the epitaxial layer interior of the body, said substrate portion having an impurity concentration therethrough of greater than about $1 \times 10^{18}$ carriers/cm$^3$ of a given carrier-type;

B. emitter, base and collector regions in said epitaxial layer; said emitter region adjoining the major surface of the body in at least one strip configuration and having an impurity concentration at the surface of at least about $1 \times 10^{18}$ carriers/cm$^3$ of a carrier-type the same as the carrier-type of said substrate portion; said collector region adjoining the substrate portion, adjoining the major surface spaced from the emitter region, having a thickness of less than about 10 microns at active portions thereof, and having an impurity concentration at active portions of less than about $1 \times 10^{14}$ carriers/cm$^3$ of a carrier-type the same as the carrier-type of the substrate portion; and said base region being between the emitter and collector regions, adjoining the major surface at least peripherally of the emitter region in an elongated configuration, having a thickness of less than about 2 microns at active portions thereof, having an impurity concentration at the active portions between about $5 \times 10^{14}$ and $5 \times 10^{17}$ carriers/cm$^3$ of a carrier-type opposite at the carrier-type of the emitter and collector regions to form PN junctions therewith;

C. first, second and third metal contacts of strip configurations on the major surface of the body being spaced apart and substantially parallel and making separate ohmic contact to the emitter, base and collector regions, respectively;

D. a dielectric layer on the major surface at least adjacent said first metal contact to the emitter region;

E. a conductor layer of strip configuration on the dielectric layer spaced from and extending substantially parallel to said first metal contact; and F. a degenerative resistor layer on the first metal contact, the dielectric layer, and the conductor layer extending substantially the length of the first metal contact and conductor layer and making ohmic contact to both the first metal contact and the conductor layer along the length thereof, while remaining substantially insulated from the second and third metal contacts and the base and collector regions.

2. A high frequency bipolar transistor with integral thermally compensated degenerative feedback resistance as set forth in claim 1 wherein:

the first metal contact is in two spaced apart substantially parallel strip configurations and the conductor layer is spaced between the strips of the first metal contact.

3. A high frequency bipolar transistor with integral thermally compensated degenerative feedback resistance as set forth in claim 1 wherein:

the resistance layer makes ohmic contact to the first metal contact only adjacent edge portions opposite from the conductor layer.

4. A high frequency bipolar transistor with integral thermally compensated degenerative feedback resistance as set forth in claim 1 comprising in addition:

G. a second conductor layer of strip configuration on the dielectric layer spaced from the second metal contact and extending substantially parallel to the second metal contact; and H. a second resistor layer on the second metal contact, the dielectric layer, and the second conductor layer extending substantially the length of the second metal contact and conductor layer and making ohmic contact to both the second metal contact and the second conductor layer along the length thereof, while remaining substantially insulated from the first and third metal contacts, the first conductor layer and the emitter and collector regions.

* * * * *